(12) United States Patent
Hsu et al.

(10) Patent No.: US 7,303,981 B2
(45) Date of Patent: Dec. 4, 2007

(54) POLYSILICON STRUCTURE, THIN FILM TRANSISTOR PANEL USING THE SAME, AND MANUFACTURING METHOD OF THE SAME

(75) Inventors: Chien-Chou Hsu, Kaohsiung (TW); Tsung-Yi Hsu, Changhua County (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/689,668

(22) Filed: Mar. 22, 2007

(65) Prior Publication Data

US 2007/0166898 A1 Jul. 19, 2007

Related U.S. Application Data

(62) Division of application No. 11/000,837, filed on Nov. 30, 2004.

(30) Foreign Application Priority Data

Jul. 9, 2004 (TW) .............................. 93120581 A

(51) Int. Cl.
*H01L 21/20* (2006.01)
(52) U.S. Cl. ...................... 438/488; 438/166
(58) Field of Classification Search ............... 438/488, 438/795, 166; 257/66, 72
See application file for complete search history.

(56) References Cited

U.S. PATENT DOCUMENTS

| | | | |
|---|---|---|---|
| 5,569,936 A | 10/1996 | Zhang et al. | |
| 6,288,412 B1 | 9/2001 | Hamada et al. | |
| 6,337,232 B1 | 1/2002 | Kusomoto et al. | |
| 7,009,207 B2 | 3/2006 | Koo et al. | |
| 2002/0168577 A1 | 11/2002 | Yoon | |
| 2002/0187569 A1 | 12/2002 | Jung | |
| 2006/0006390 A1* | 1/2006 | Hsu et al. ............... | 257/72 |

* cited by examiner

*Primary Examiner*—Mark V. Prenty
(74) *Attorney, Agent, or Firm*—Thomas, Kayden, Horstemeyer & Risley

(57) ABSTRACT

A method for forming a polysilicon structure is provided. An amorphous silicon structure with a first amorphous silicon region and a second amorphous silicon region is formed in a first region and a second region of a substrate, respectively. The first amorphous silicon region is thinner than the second amorphous silicon region. The amorphous silicon structure is crystallized to form the polysilicon structure with a first polysilicon region and a second polysilicon region corresponding to the first amorphous silicon region and the second amorphous silicon region.

11 Claims, 7 Drawing Sheets

POLYSILICON STRUCTURE, THIN FILM TRANSISTOR PANEL USING THE SAME, AND MANUFACTURING METHOD OF THE SAME

CROSS REFERENCE TO RELATED APPLICATIONS

This application is a Divisional of pending U.S. patent application Ser. No. 11/000,837, filed Nov. 30, 2004 and entitled "POLYSILICON STRUCTURE, THIN FILM TRANSISTOR PANEL USING THE SAME, AND MANUFACTURING METHOD OF THE SAME," the contents of which are incorporated by reference herein.

BACKGROUND

The present invention relates to a low temperature polysilicon film and in particular to a polysilicon structure formed by crystallization of an amorphous silicon structure, methods for forming the same, and devices utilizing the film.

Typically, thin film transistors (TFTs) are used as the active devices in active matrix flat panel displays. For example, TFTs are employed to drive the liquid crystal display (LCD) or the organic light emitting display (OLED).

Conventionally, hydrogenated amorphous silicon ($\alpha$-Si: H) is used as the semiconductor film (active layer) of a TFT. Polysilicon, however, may provide higher electron transmission than amorphous silicon due to more regular crystal orientation. Thus a development trend is to utilize the polysilicon instead of amorphous silicon in TFT technology.

Typically, there are three methods for forming the thin polysilicon film. In a first method, the polysilicon film is formed by deposition. In this method, the polysilicon film requires a sufficient thickness, so as to grow large grains. Thus, the polysilicon film has a poor surface uniformity that adversely affects the formation of the subsequent gate insulating layer. Moreover, the deposition temperature is high (600° C.), which also adversely affects the fabrication of the device. In a second method, thermal treatment is performed on an amorphous silicon layer, so as to transfer to a polysilicon layer. In this method, the polysilicon layer may be less thick and have a better surface uniformity. However, a high deposition temperature (600° C.) and long deposition duration are required and the thermal budget increases. As a result, throughput and device reliability suffer. In a third method, perform a laser treatment to transfer an amorphous silicon layer into a polysilicon layer. The method is the most commonly used.

The polysilicon TFT display comprises a display region and a driving circuit region, wherein the switching devices on the driving circuit region require higher switching rate and readability. That is, the switching devices on the driving circuit region preferably have higher electron transmission and better sub-threshold swing. A polysilicon layer with large grain size can provide such electronic characteristics. Additionally, current leakage in the display region must be low. If the surface roughness of the polysilicon layer is too high, poor coverage of the gate insulating layer thereon results, thus increasing current leakage. If the grain size of the polysilicon layer is small, low surface roughness results, improving the coverage of the gate insulating layer thereon and reducing current leakage. That is, in order to improve the electronic characteristics of the polysilicon TFT display, the polysilicon layer on the driving circuit region must have a relatively large grain size and that on the display region a relatively small grain size.

In order to form a polysilicon film with different grain sizes on the driving circuit region and the display region, respectively, for fabrication of the polysilicon TFT display, the driving circuit region and the display region must be respectively treated. For example, a laser treatment with a relatively low scanning rate is performed on the amorphous silicon layer on the driving circuit region, to form the polysilicon layer with a relatively large grain size. The laser treatment with a relatively high scanning rate is subsequently performed on the amorphous silicon layer on the display region, to form the polysilicon layer with relatively small grain size. The problems presented by laser alignment and mask changes may reduce yield and throughput. Thus, an improved method for forming polysilicon layers with different grain sizes is desirable.

SUMMARY

Embodiments of the invention provide a polysilicon structure on a substrate. The polysilicon structure comprises a first polysilicon region and a second polysilicon region. A thickness of the first polysilicon region is less than that of the second a thickness and a grain size of the first polysilicon region is larger than that of the second polysilicon region.

Embodiments of the invention additionally provide a method for forming a polysilicon structure. A substrate having a first region and a second region is provided. An amorphous silicon structure with a first amorphous silicon region and a second amorphous silicon region is formed in the first region and the second region, respectively. The first amorphous silicon region is thinner than the second amorphous silicon region. The amorphous silicon structure is crystallized to form the polysilicon structure with a first polysilicon region and a second polysilicon region corresponding to the first and second amorphous silicon regions, respectively.

Embodiments of the invention further provide a method for forming a polysilicon structure. A substrate having a first region, a second region, and a third region is provided. An amorphous silicon layer with a first amorphous silicon region, a second amorphous silicon region, and a third amorphous silicon region, is formed on the substrate, in which the first, second and third amorphous silicon regions, are respectively in the first region, the second region and the third region. The first amorphous silicon region is thinner than the second amorphous silicon region, which is thinner than the third amorphous silicon region. The amorphous silicon structure is crystallized to form the polysilicon structure with a first polysilicon region, a second polysilicon region and a third polysilicon region corresponding to the first, second and third amorphous silicon regions, respectively.

Embodiments of the invention still further provide a flat panel display. The display comprises a first transistor and a second transistor. The first transistor is disposed on the substrate and comprises a first polysilicon region serving as a first active region. The second transistor is disposed on the substrate and comprises a second polysilicon region serving as a second active region. Moreover, the first polysilicon region is thinner than the second polysilicon region and a grain size of the first polysilicon region is larger than that of the second polysilicon region.

BRIEF DESCRIPTION OF THE DRAWINGS

Embodiments of the invention will become more fully understood from the detailed description given hereinbelow and the accompanying drawings, given by way of illustration only and thus not intended to be limitative of the invention.

DETAILED DESCRIPTION

Figure 1A:
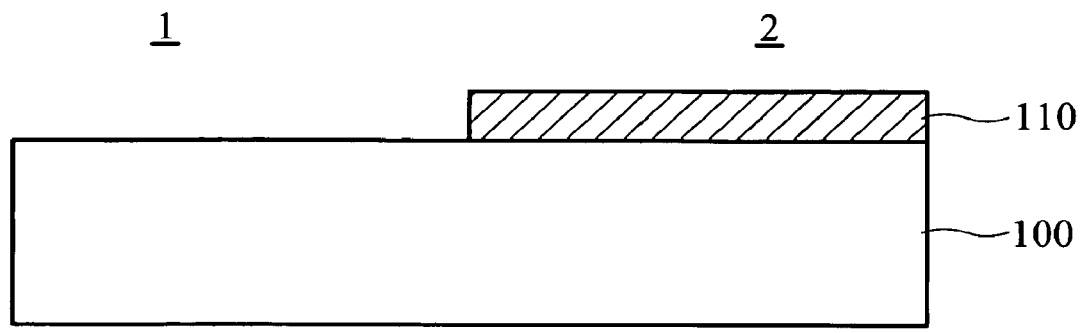
FIGS. 1A to 1C are cross-sections of a method for forming a polysilicon structure of the first embodiment of the present invention.

In the first embodiment, as shown in FIG. 1A, a substrate 100 comprising a driving circuit region 1 and a display region 2 is provided. A first amorphous silicon layer 110 is formed on the substrate 100 corresponding to the display region 2 of the substrate 100 by deposition, lithography, and etching. For example, an amorphous silicon layer (not shown) is formed by chemical vapor deposition (CVD). Thereafter, lithography and etching are performed on the amorphous silicon layer to form the first amorphous silicon layer 110 in the display region 2 of the substrate 100, wherein the etching may comprise wet or dry etching.

Figure 1B:
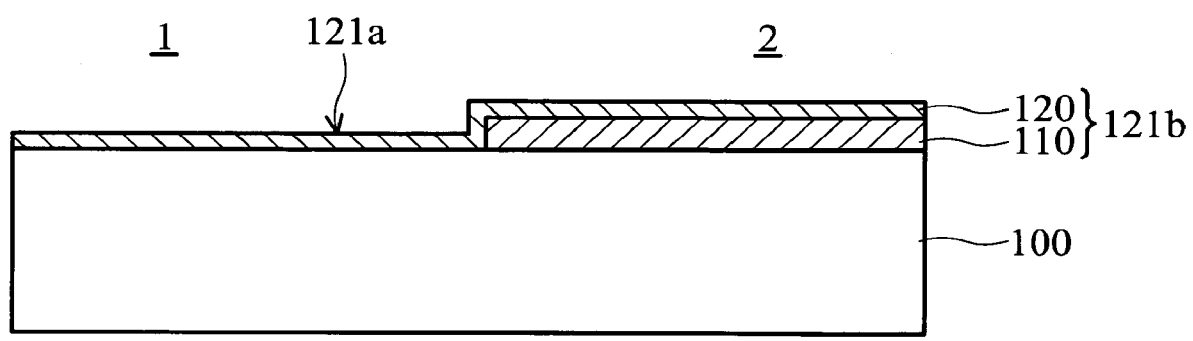

A second amorphous silicon layer 120 is subsequently formed on the substrate 100 corresponding to the driving circuit region 1 of the substrate 100 and covers the first amorphous silicon layer 110 in the display region 2, as shown in FIG. 1B. As a result, an amorphous silicon structure with a first amorphous silicon region 121a in the driving circuit region 1 and a second amorphous silicon region 121b in the display region 2 is formed on the substrate 100. The difference in thickness between the first amorphous silicon region 121a in the driving circuit region 1 and the second amorphous silicon region 121b in the display region 2 must be maintained within a specific range. If the difference in thickness of the first amorphous silicon region 121a and the second amorphous silicon region 121b is too low, the difference in grain size therebetween is small, thus, the electronic characteristics of the polysilicon TFT are reduced. Conversely, if the difference in thickness of the first amorphous silicon region 121a and the second amorphous silicon region 121b is too high, further adjustment of process conditions is required, such as the ion implanting energy and dosage, complicating the process. Therefore, the difference in thickness must be maintained within a range of about 100 to 1000 Å, and preferably 200 to 400 Å.

Figure 1C:
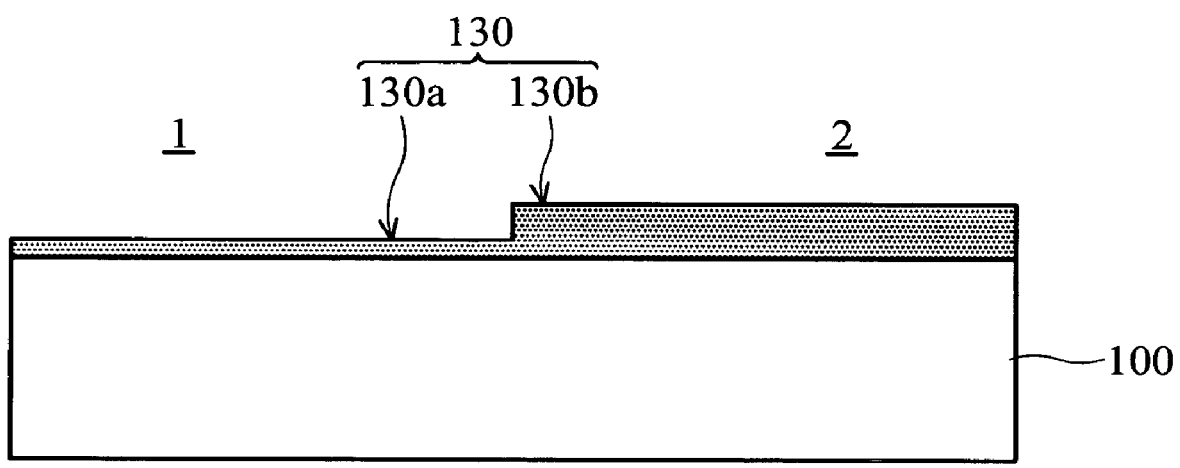

The amorphous silicon structure is crystallized. That is, crystallization is simultaneously performed on the first and second amorphous silicon regions 121a and 121b, such that the amorphous silicon structure is transferred into a polysilicon structure 130 with a first polysilicon region 130a and a second polysilicon region 130b corresponding to the first amorphous silicon region 121a and a second amorphous silicon region 121b, respectively, as shown in FIG. 1C. In some embodiments, the crystallization may comprise a laser treatment that employs, for example, an excimer laser, continuous wave laser (CW laser), or laser beam pulse. Moreover, the laser treatment may comprise lateral solidification (LS), sequential lateral solidification (SLS), continuous grain silicon (CGS), or metal induced lateral crystallization (MILC).

Since the thickness of the second amorphous silicon layer 120 in the driving circuit region 1 is less than the total thickness of the first and second amorphous silicon layers 110 and 120 in the display region 2, the meltability of the second amorphous silicon layer 120 in the driving circuit region 1 after the laser treatment, is higher than that of the first and second amorphous silicon layers 110 and 120 in the display region 2. Accordingly, the first polysilicon region 130a in the driving circuit region 1 can be formed with larger grain size, thereby effectively improving electron mobility and sub-threshold swing. Conversely, since the total thickness of the first and second amorphous silicon layers 110 and 120 in the display region 2 is thicker than that of the second amorphous silicon layer 120 in the driving circuit region 1, the meltability of the first and second amorphous silicon layers 110 and 120 in the display region 2 after the laser treatment, is lower than that of the second amorphous silicon layer 120 in the driving circuit region 1. Accordingly, the second polysilicon region 130b in the display region 2 can be formed with smaller grain size, thereby lowering the surface roughness of the polysilicon layer 130 in the display region 2 to reduce current leakage. In the first embodiment, the mentioned potential advantages can be obtained with one laser treatment procedure, eliminating problems presented by laser alignment and mask changes, thus reducing process time.

Figure 2A:
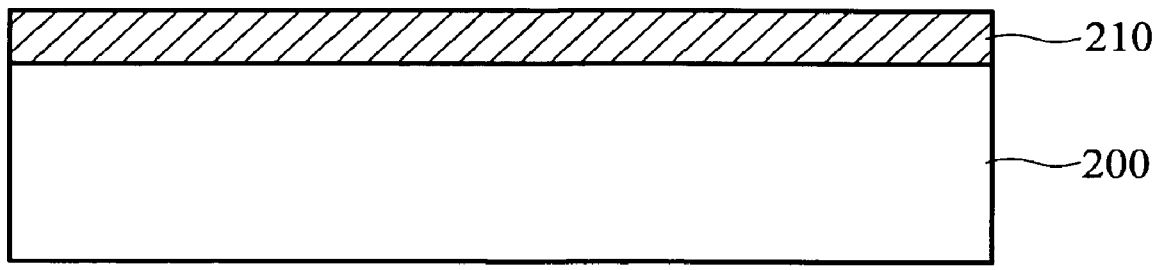
FIGS. 2A to 2D are cross-sections of a method for forming a polysilicon structure of the second embodiment of the present invention.

In the second embodiment, as shown in FIG. 2A, a substrate 200 comprising a driving circuit region 3 and a display region 4 is provided. A first amorphous silicon layer 210 is formed on the substrate 200. For example, the amorphous silicon layer 210 is formed by chemical vapor deposition (CVD).

Figure 2B:
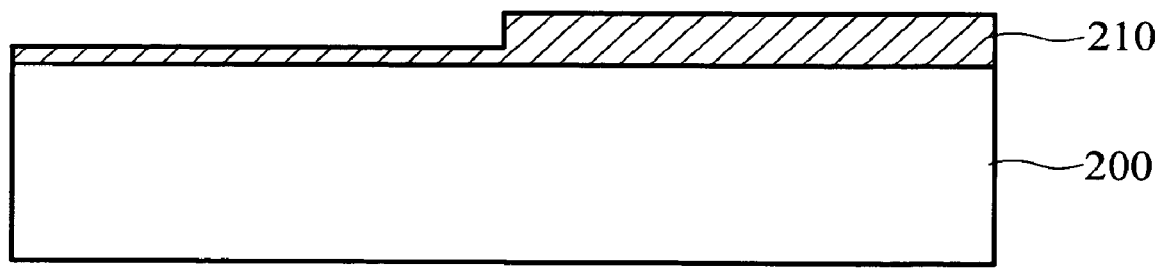

Thereafter, the first amorphous silicon layer 210 in the driving circuit region 3 is partially removed by lithography and etching to form the first amorphous silicon layer 210 with differing thicknesses respectively in the driving circuit region 3 and display region 4, as shown in FIG. 2B. Here, the etching may comprise wet or dry etching. Moreover, the difference in thickness between the first amorphous silicon layer 210 in the driving circuit region 3 and that in the display region 4 must be maintained within a specific range.

Figure 2C:
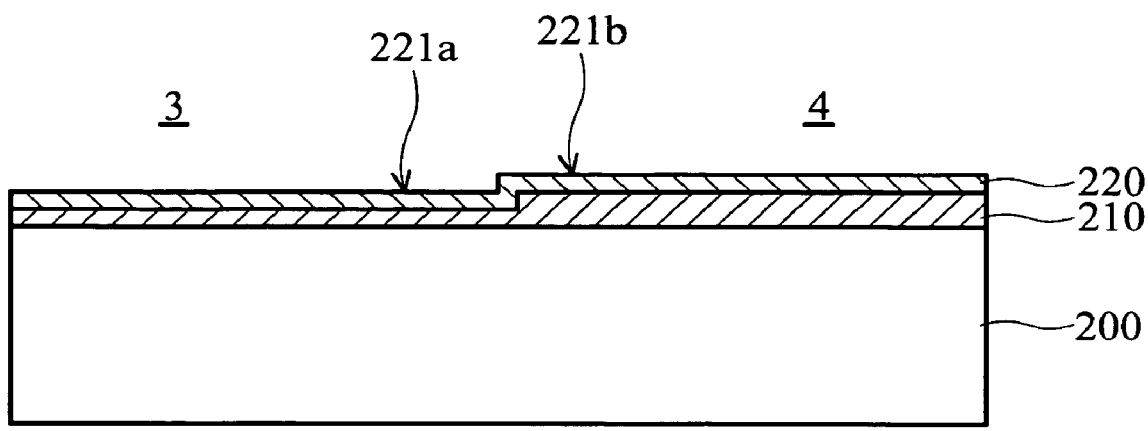

A second amorphous silicon layer 220 is subsequently formed on the first amorphous silicon layer 210 in the driving circuit region 3 and the display region 4, as shown in FIG. 2C. As a result, an amorphous silicon structure with a first amorphous silicon region 221a in the driving circuit region 3 and a second amorphous silicon region 221b in the display region 4 is formed on the substrate 100. Since the difference in thickness between the first amorphous silicon layer 210 in the driving circuit region 3 and that in the display region 4 is maintained within a specific range, the difference in thickness can be maintained within a specific range after forming the second amorphous silicon layer 220 on the first amorphous silicon layer 210. As mentioned, if the difference in thickness is too low, the difference in grain size between the subsequently formed polysilicon silicon layer in the driving circuit region 3 and that in the display region 4 is small, reducing the electronic characteristics of the polysilicon TFT. Conversely, if the difference in thickness is too high, further adjustment of process conditions is required, such as the ion implanting energy and dosage, complicating the process. Thus, the difference in thickness must be maintained within a range of about 100 to 1000 Å, and preferably 200 to 400 Å.

Figure 2D:
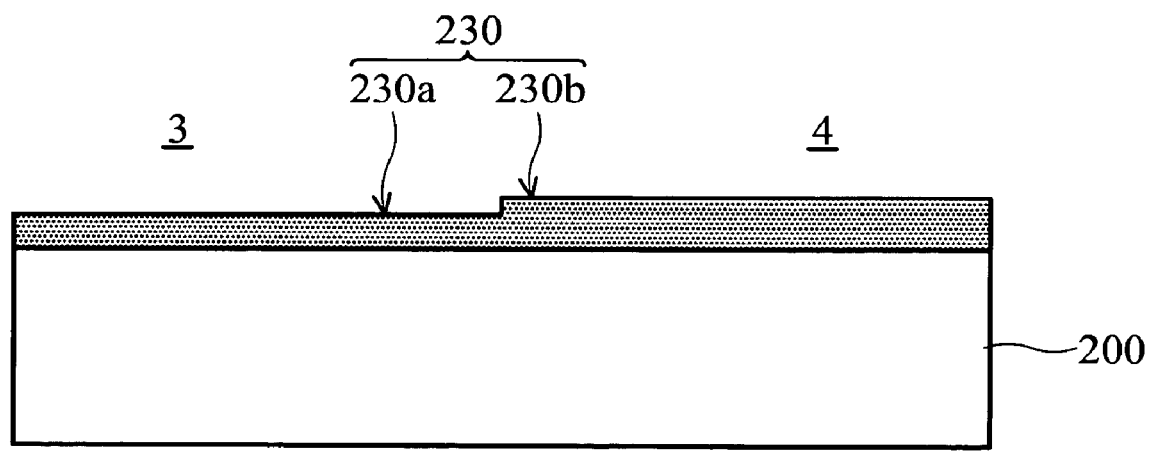

The amorphous silicon structure is crystallized. That is, crystallization is simultaneously performed on the first and second amorphous silicon regions 221a and 221b, such that the amorphous silicon structure is transferred into a polysilicon structure 230 with a first polysilicon region 230a and a second polysilicon region 230b corresponding to the first amorphous silicon region 221a and a second amorphous silicon region 221b, respectively, as shown in FIG. 2D. In the second embodiment, the crystallization may comprise a laser treatment that employs, for example, an excimer laser, continuous wave laser (CW laser), or laser beam pulse. Moreover, the laser treatment may comprise lateral solidification (LS), sequential lateral solidification (SLS), continuous grain silicon (CGS), or metal induced lateral crystallization (MILC).

Since the thickness of the second amorphous silicon layer 220 in the driving circuit region 3 is less than the total thickness of the first and second amorphous silicon layers 210 and 220 in the display region 4, the meltability of the second amorphous silicon layer 220 in the driving circuit region 3 after the laser treatment, is higher than that of the first and second amorphous silicon layers 210 and 220 in the display region 4. Accordingly, the first polysilicon region 230a in the driving circuit region 3 can be formed with larger grain size, thereby effectively improving electron mobility and sub-threshold swing. Conversely, since the total thickness of the first and second amorphous silicon layers 210 and 220 in the display region 4 is greater than that of the second amorphous silicon layer 220 in the driving circuit region 3, the meltability of the first and second amorphous silicon layers 210 and 220 in the display region 4 after the laser treatment, is lower than that of the amorphous silicon layer 220 in the driving circuit region 3. Accordingly, the second polysilicon region 230b on the display region 4 can be formed with smaller grain size, thereby lowering the surface roughness of the polysilicon layer 230 in the display region 4 to reduce current leakage. In the second embodiment, the mentioned potential advantages can be obtained with one laser treatment procedure, eliminating problems presented by laser alignment and mask changes, thus reducing process time.

Figure 3A:
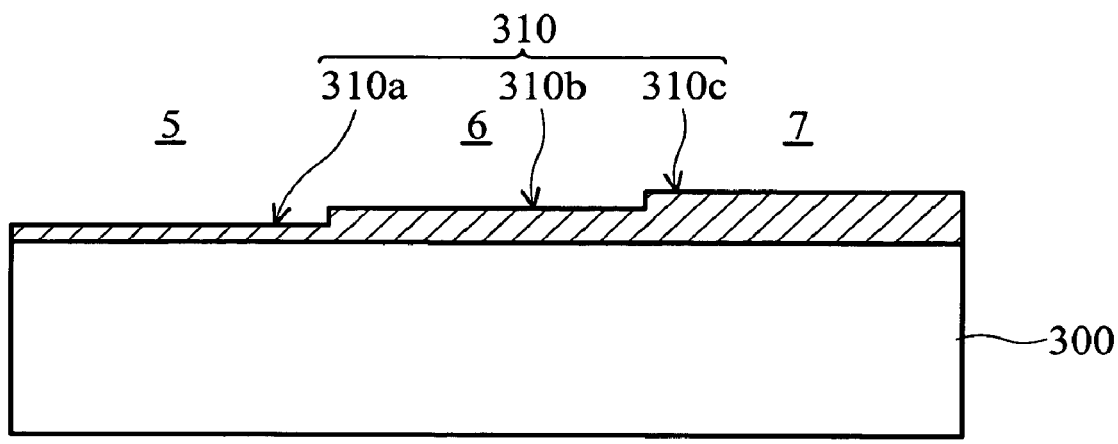
FIGS. 3A to 3B are cross-sections of a method for forming a polysilicon structure of the third embodiment of the present invention.

In the third embodiment, as shown in FIG. 3A, a substrate 300 comprising a first region 5, a second region 6 and a third region 7 is provided. An amorphous silicon structure 310 with a first amorphous silicon region 310a in the first region 5, a second amorphous silicon region 310b in the second region 6 and a third amorphous silicon region 310c in the third region 7 is formed on the substrate 300, wherein the thicknesses of the amorphous silicon structure 310 in the first, second, and third regions 5, 6, and 7 are different. For example, the first amorphous silicon region 310a in the first region 5 has a thickness less than that of the third amorphous silicon region 310c in the third region 7, and the second amorphous silicon region 310b in the second region 6 has a thickness between that of the first and third amorphous silicon regions 310a and 310c in the first and third regions 5 and 7.

The difference in thickness between the amorphous silicon structure 310 in the first region 5 and the third region 7 must be maintained within a specific range. If the difference in thickness is too low, the difference in grain size between the subsequently formed polysilicon silicon structure in different regions is small, thus the electronic characteristics of the polysilicon TFT are reduced. Conversely, if the difference in thickness is too high, further adjustment of process conditions is required, such as the ion implanting energy and dosage, complicating the process. In the third embodiment, the difference in thickness may be maintained within a range of about 100 to 1000 Å, and preferably 200 to 400 Å.

Figure 3B:
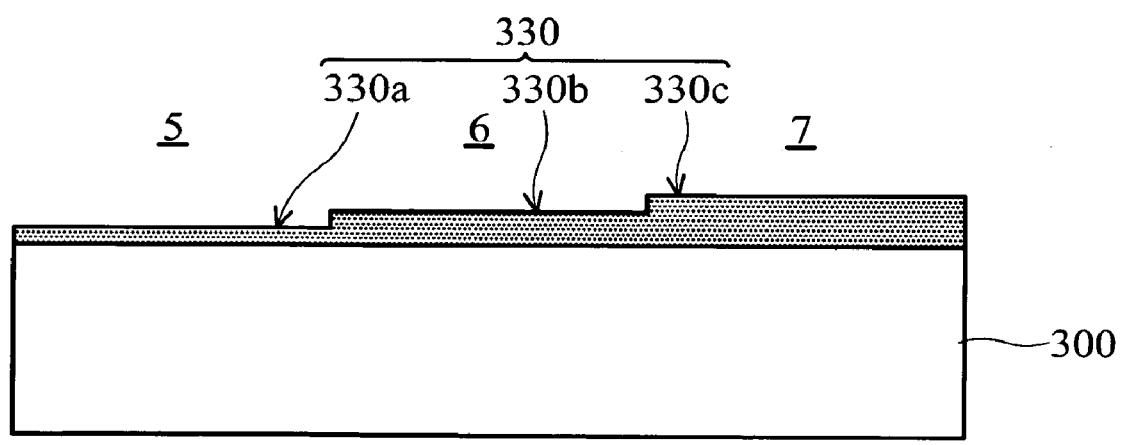

The amorphous silicon structure 310 is crystallized. That is, crystallization is simultaneously performed on the first, second, and third amorphous silicon regions 310a, 310b, and 310c, such that the amorphous silicon structure 310 is transferred into a polysilicon structure 330 with a first polysilicon region 330a, a second polysilicon region 330b, and a third polysilicon region 330c corresponding to the first, second, and third amorphous silicon regions 310a, 310b, and 310c, respectively, as shown in FIG. 3B. In the third embodiments, the crystallization may comprise a laser treatment that employs, for example, an excimer laser, continuous wave laser (CW laser), or laser beam pulse. Moreover, the laser treatment may comprise lateral solidification (LS), sequential lateral solidification (SLS), continuous grain silicon (CGS), or metal induced lateral crystallization (MILC).

Since the thicknesses (surface levels) of the amorphous silicon structure 310 in the first, second, and third regions 5, 6, and 7 are successively increased, the meltability of the amorphous silicon structure 310 in the first, second, and third regions 5, 6, and 7 are successively decreased after the laser treatment. Accordingly, the grain sizes and surface roughness of the subsequently formed polysilicon layer 330 in the first, second, and third regions 5, 6, and 7 are successively decreased. That is, the polysilicon structure 330 with different grain sizes in different regions 5, 6, and 7 can be accomplished by performing one laser treatment procedure on the amorphous silicon structure 310 having different thicknesses in different regions 5, 6, and 7, thereby eliminating problems presented by laser alignment and mask changes, thus reducing process time.

Figure 4A:
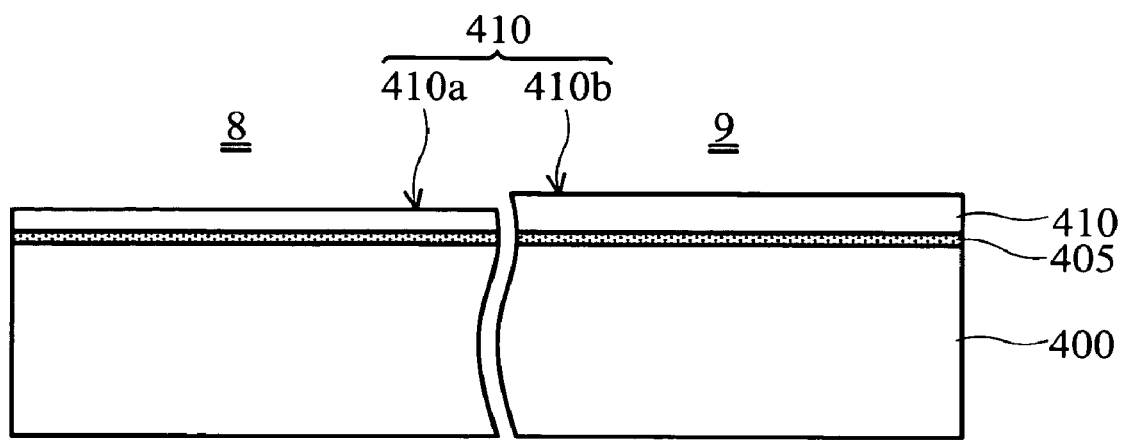
FIGS. 4A to 4C are cross-sections of a method for forming thin film transistors for a flat panel display of the fourth embodiment of the present invention.
Figure 4B:
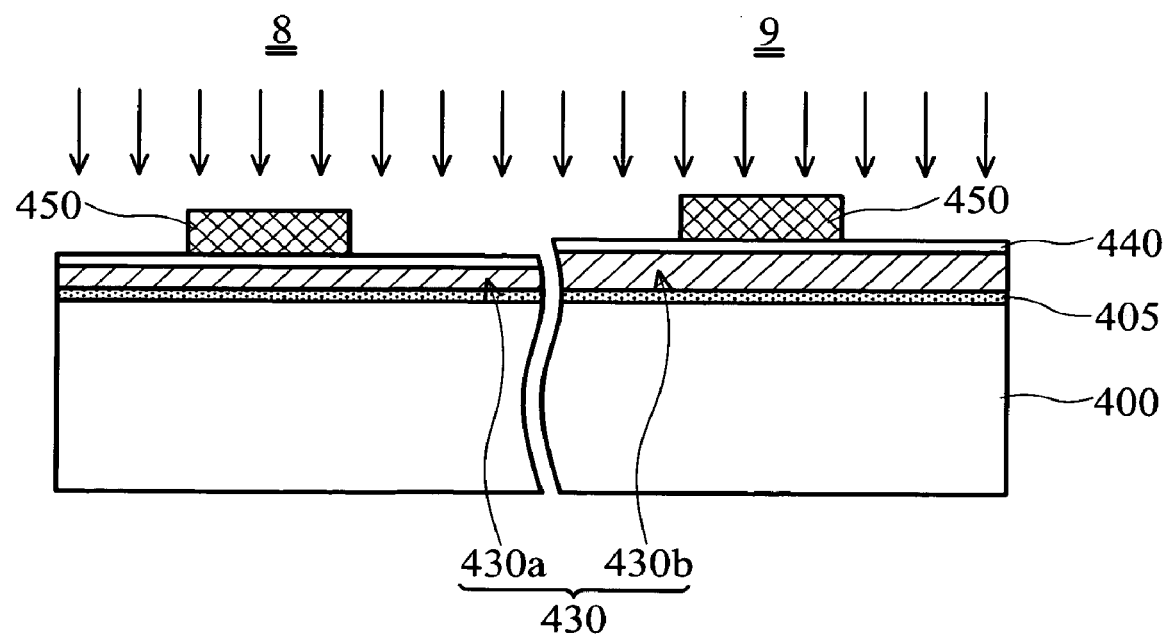
Figure 4C:
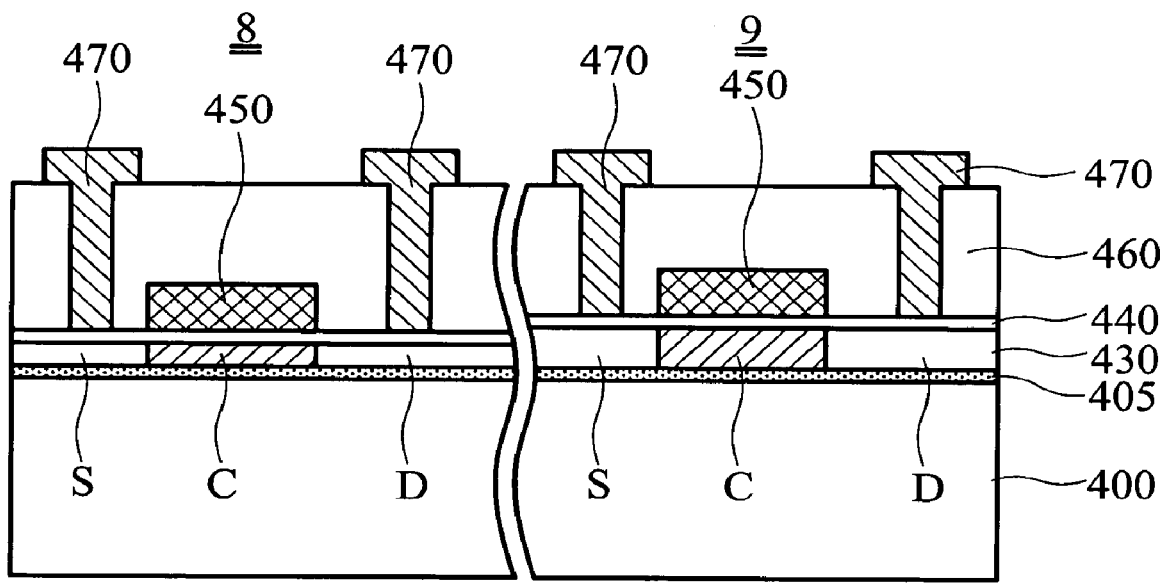

In the fourth embodiment, as FIG. 4C illustrates, thin film transistors for a flat panel display are provided. The thin film transistors are disposed on a substrate 400 comprising a driving circuit region 8 and a display region 9. A polysilicon structure 430 with a first polysilicon region 410a and a second polysilicon region 410b is disposed on the substrate 400. The first and second polysilicon regions 410a and 410b have different thickness and grain sizes. For example, the first polysilicon region 430a in the driving circuit region 8 is thinner, has a larger grain size, and a higher surface roughness than that of the second polysilicon region 430b in the display region 9, thereby improving electron mobility and sub-threshold swing of the thin film transistor in the driving circuit region 8 and reducing current leakage of the thin film transistor in the display region 9.

FIGS. 4A to 4C illustrate a method for forming thin film transistors for a flat panel display of the fourth embodiment of the present invention. As shown in FIG. 4A, a substrate 400 comprising a driving circuit region 8 and a display region 9 is provided. A buffer layer 405 is subsequently formed on the substrate 400. An amorphous silicon structure 410 with a first amorphous silicon region 410a and a second amorphous silicon region 410b is formed on the buffer layer 405. The first amorphous silicon layer 410a in the driving circuit region 8 has a thickness less than that of the second amorphous silicon region 410b in the display region 9. The difference in thickness between the amorphous silicon structure 410 in the driving circuit region 8 and that in the display region 9 may be maintained within a specific range. For example, the difference in thickness may be maintained within a range of about 100 to 1000 Å, and preferably 200 to 400 Å.

Thereafter, crystallization is simultaneously performed on the amorphous silicon structure 410 in the driving circuit region 8 and the display region 9, such that the amorphous silicon structure 410 is transferred into a polysilicon structure 430, as shown in FIG. 4B. In this embodiment, the crystallization may comprise a laser treatment which employs, for example, an excimer laser, continuous wave laser (CW laser), or laser beam pulse. Moreover, the laser treatment may comprise lateral solidification (LS), sequential lateral solidification (SLS), continuous grain silicon (CGS), or metal induced lateral crystallization (MILC).

Gate insulating layer 440 is formed on the polysilicon structure 430. Gates 450 is subsequently formed on the gate insulating layer 440, as shown in FIG. 4B. Thereafter, ion implantation is performed on the polysilicon layer 430 using the gates 450 as masks to form sources S, drains D, and channels C.

An interlayer dielectric (ILD) layer 460 is formed on the gate insulating layer 440 and covers the gates 450. Next, interconnects 470 are formed in the ILD layer 460, as shown in FIG. 4C. Finally, processes for fabricating the flat panel display are then successively proceeded and the flat panel display (not shown) is complete.

While the invention has been described by way of example and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for forming a polysilicon structure, comprising:
   providing a substrate having a first region, a second region, and a third region;
   forming an amorphous silicon structure on the substrate with a first amorphous silicon region in the first region, a second amorphous silicon region in the second region, and a third amorphous silicon region in the third region, wherein the first amorphous silicon region is thinner than the second amorphous silicon region which is thinner than the third amorphous silicon region; and
   crystallizing the amorphous silicon structure to form the polysilicon structure with a first polysilicon region, a second region, and a third polysilicon region corresponding to the first amorphous silicon region, a second amorphous silicon region, and a third amorphous silicon region, respectively, wherein the first polysilicon region has a grain size larger than that of the second polysilicon region which has a grain size larger than that of the third polysilicon region.

2. The method as claimed in claim 1, wherein the difference in thickness between the first polysilicon region and the third polysilicon region is about 100 to 1000 Å.

3. The method as claimed in claim 1, wherein the difference in thickness between the first polysilicon region and the third polysilicon region is about 200 to 400 Å.

4. The method as claimed in claim 1, wherein the difference in thickness between the first polysilicon region and the second polysilicon region is about 100 to 1000 Å.

5. The method as claimed in claim 1, wherein the difference in thickness between the first polysilicon region and the second polysilicon region is about 200 to 400 Å.

6. The method as claimed in claim 1, wherein the difference in thickness between the second polysilicon region and the third polysilicon region is about 100 to 1000 Å.

7. The method as claimed in claim 1, wherein the difference in thickness between the second polysilicon region and the third polysilicon region is about 200 to 400 Å.

8. The method as claimed in claim 1, wherein the crystallizing comprises a laser treatment.

9. The method as claimed in claim 8, wherein the laser treatment employs an excimer laser, continuous wave laser, or laser beam pulse.

10. The method as claimed in claim 8, wherein the laser treatment comprises lateral solidification, sequential lateral solidification, continuous grain silicon, or metal induced lateral crystallization.

11. A method for forming a polysilicon structure, comprising:
    providing a substrate having a first region, a second region, and a third region;
    forming an amorphous silicon structure on the substrate with a first amorphous silicon region in the first region, a second amorphous silicon region in the second region, and a third amorphous silicon region in the third region, wherein the first amorphous silicon region is thinner than the second amorphous silicon region which is thinner than the third amorphous silicon region; and
    crystallizing the amorphous silicon structure to form the polysilicon structure with a first polysilicon region, a second region, and a third polysilicon region corresponding to the first amorphous silicon region, a second amorphous silicon region, and a third amorphous silicon region, respectively, wherein the first polysilicon region has a surface roughness higher than that of the second polysilicon region which has a surface roughness higher than that of the third polysilicon region.

* * * * *